(12) United States Patent
Meneboo et al.

(10) Patent No.: US 12,167,570 B2
(45) Date of Patent: Dec. 10, 2024

(54) WATER BLOCK ASSEMBLY HAVING AN INSULATING HOUSING

(71) Applicant: OVH, Roubaix (FR)

(72) Inventors: Alexandre Alain Jean-Pierre Meneboo, Harnes (FR); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 186 days.

(21) Appl. No.: 17/677,209

(22) Filed: Feb. 22, 2022

(65) Prior Publication Data
US 2022/0287203 A1   Sep. 8, 2022

(30) Foreign Application Priority Data

Mar. 3, 2021   (EP) ..................................... 21305256

(51) Int. Cl.
*H05K 7/20* (2006.01)
*G06F 1/20* (2006.01)

(52) U.S. Cl.
CPC ......... *H05K 7/20272* (2013.01); *G06F 1/206* (2013.01)

(58) Field of Classification Search
CPC ........... H05K 7/20272; H05K 7/20281; H05K 7/2029; G06F 1/206
USPC ...................................................... 165/80.4
See application file for complete search history.

(56) References Cited

U.S. PATENT DOCUMENTS

| | | | |
|---|---|---|---|
| 6,367,544 B1 * | 4/2002 | Calaman | H01L 23/4334 174/16.3 |
| 6,578,626 B1 * | 6/2003 | Calaman | F28F 3/12 257/E23.098 |
| 6,912,130 B2 | 6/2005 | Osanai et al. | |
| 7,301,770 B2 * | 11/2007 | Campbell | F28F 3/022 257/E23.09 |
| 7,564,129 B2 * | 7/2009 | Nakanishi | F28F 3/12 257/713 |
| 10,593,608 B2 | 3/2020 | Eisele et al. | |
| 10,685,894 B2 | 6/2020 | Eisele | |
| 2003/0131972 A1 | 7/2003 | Cosley et al. | |
| 2004/0062009 A1 * | 4/2004 | Osanai | C04B 37/026 257/E23.098 |

(Continued)

FOREIGN PATENT DOCUMENTS

| | | |
|---|---|---|
| DE | 102008006104 A1 | 10/2008 |
| EP | 2562382 A2 | 2/2013 |

(Continued)

OTHER PUBLICATIONS

Extended Europen Search Report with regard to the counterpart EP Patent Application No. 21305256.6 completed Aug. 27, 2021.

(Continued)

*Primary Examiner* — Claire E Rojohn, III
(74) *Attorney, Agent, or Firm* — BCF LLP

(57) ABSTRACT

A water block assembly comprising a water block unit and an insulating housing, and a method for insulating a water block unit are provided. The water block unit has an external thermal transfer surface configured to be in contact with a heat generating component to be cooled, and defines an internal fluid conduit for circulating fluid therein, a fluid inlet for feeding fluid into the internal fluid conduit, and a fluid outlet for discharging fluid from the internal fluid conduit. The insulating housing at least partly embeds the water block unit therein to limit heat transfer from the water block unit to a surrounding environment thereof, the insulating housing having an internal surface in contact with the water block unit.

13 Claims, 11 Drawing Sheets

(56) References Cited

U.S. PATENT DOCUMENTS

| | | |
|---|---|---|
| 2007/0124934 A1 | 6/2007 | Peng |
| 2009/0056915 A1 | 3/2009 | Tsai |
| 2013/0048253 A1 | 2/2013 | Yang |
| 2016/0309618 A1 | 10/2016 | Tsai et al. |
| 2018/0139865 A1 | 5/2018 | Draht et al. |
| 2019/0174653 A1* | 6/2019 | Fan .......................... G06F 1/20 |
| 2019/0239388 A1 | 8/2019 | Tsai |
| 2019/0348338 A1 | 11/2019 | Rometsch et al. |
| 2020/0060035 A1 | 2/2020 | Hansen |
| 2020/0396866 A1 | 12/2020 | Chen et al. |

FOREIGN PATENT DOCUMENTS

| | | |
|---|---|---|
| EP | 3620741 A1 | 3/2020 |
| WO | 2010058274 A1 | 5/2010 |
| WO | 2019/103265 A1 | 5/2019 |

OTHER PUBLICATIONS

N@irolf: "CPU Kühlkomplex mit Isolation (Blogbeitrag)", https://www.hardwareluxx.de/community/thre ads/was-isolieren-f%C3%BCr-chiller-wassert emp-O%C2%B0c-bilder.356578/, May 17, 2017, Retrieved from the Internet: URL: https://www.hardwareluxx.de/community/ threads/was-isolieren-f%C3%BCr-chiller-wassertemp-O%C2%B0c-bilder.356578/ retrieved on Aug. 18, 2021, pdf 1 page.
English Abstract for DE102008006104 retrieved on Espacenet on Feb. 22, 2022.
English Abstract for EP2562382 retrieved on Espacenet on Feb. 22, 2022.

* cited by examiner

WATER BLOCK ASSEMBLY HAVING AN INSULATING HOUSING

CROSS REFERENCE

The present application claims priority from European Patent Application No. EP21305256.6, filed on Mar. 3, 2021, the entirety of which is incorporated by reference herein.

FIELD OF TECHNOLOGY

The present technology relates to water blocks for cooling heat-generating components.

BACKGROUND

Heat dissipation is an important consideration for computer systems. Notably, many components of a computer system, such as a processor (also referred to as central processing unit (CPU)), generate heat and thus require cooling to avoid performance degradation and, in some cases, failure. Similar considerations arise for systems other than computer systems (e.g., power management systems). Different types of cooling systems are therefore implemented to promote heat dissipation from heat-generating components, with the objective being to efficiently collect and conduct thermal energy away from heat-generating components.

Heat sinks rely on a heat transfer medium (e.g., a gas or liquid) to carry away the heat generated by a heat-generated component. For instance, a water block, which is a water-cooling heat sink, is thermally coupled to the component to be cooled (e.g., a processor) and water, or other heat transfer fluid, is made to flow through a conduit in the water block to absorb heat from the heat-generating component. As water flows out of the water block, so does the thermal energy collected thereby.

However, water blocks can be prone to thermal energy dissipation with surrounding ambient air which can negatively affect their cooling efficiency. This reduces the amount of thermal energy that the water carries away from the heat-generating component and thus negatively affects the cooling efficiency of the water block. Moreover, water blocks are sometimes susceptible to leaks, which can decrease their efficiency.

There is therefore a desire for a water block assembly which can alleviate at least some of these drawbacks.

SUMMARY

It is an object of the present technology to ameliorate at least some of the inconveniences present in the prior art.

According to one aspect of the present technology, there is provided a water block assembly comprising: a water block unit having an external thermal transfer surface configured to be in contact with a heat generating component to be cooled, the water block unit defining: an internal fluid conduit for circulating fluid therein; a fluid inlet for feeding fluid into the internal fluid conduit; and a fluid outlet for discharging fluid from the internal fluid conduit; and an insulating housing at least partly embedding the water block unit therein to limit heat transfer from the water block unit to a surrounding environment thereof, the insulating housing having an internal surface in contact with the water block unit.

In some embodiments, the water block unit comprises a base portion defining the external thermal transfer surface; and a cover portion affixed to the base portion, the cover portion defining the fluid inlet and the fluid outlet, the base portion and the cover portion defining the internal fluid conduit together.

In some embodiments, the water block unit has a height measured along a height direction of the water block assembly that is generally normal to the external thermal transfer surface; and a portion of the water block unit is not overlapped by the insulating housing along the height direction.

In some embodiments, the insulating housing has a lower external surface extending generally parallel to the external thermal transfer surface, the lower external surface being offset from the external thermal transfer surface in the height direction.

In some embodiments, the water block unit has lateral side surfaces extending upward from the external thermal transfer surface; and the portion of the water block unit that is not overlapped by the insulating housing includes the external thermal transfer surface and at least part of the lateral side surfaces of the water block unit such that, in use, the insulating housing is clear of the heat generating component when the external thermal transfer surface is in contact with the heat generating component.

In some embodiments, the insulating housing is made of an insulating material comprising at least one of: mortar, polyurethane foam, pressed wood, and epoxy.

In some embodiments, the fluid inlet and the fluid outlet are embedded by the insulating housing.

In some embodiments, an inlet external conduit and an outlet external conduit are fluidly connected to the fluid inlet and the fluid outlet respectively, a portion of each of the inlet and outlet external conduits being embedded by the insulating housing.

In some embodiments, an interface between the inlet external conduit and the fluid inlet and an interface between the outlet external conduit and the fluid outlet are embedded by the insulating housing.

In some embodiments, the insulating housing has external surfaces; and a material of the insulating housing fills a volume defined between the internal surface and the external surfaces of the insulating housing.

In some embodiments, the insulating housing is overmolded on the water block unit.

According to another aspect of the present technology, there is provided a method for insulating a water block unit, the water block unit having an external thermal transfer surface configured to be in contact with a heat generating component to be cooled, the water block unit defining an internal fluid conduit for circulating fluid therein, the water block unit defining a fluid inlet and a fluid outlet for feeding fluid into and discharging fluid from the internal fluid conduit respectively, the method comprising: placing the water block unit in a mold; filling the mold with an insulating material in a pliable raw state such that the insulating material covers the water block unit; and curing the insulating material until the insulating material is in a solidified state and forms an insulating housing partly embedding the water block unit.

In some embodiments, an inner bottom surface of the mold defines a recess; and placing the water block unit in the mold comprises placing a bottom portion of the water block unit in the recess, the bottom portion of the water block unit including the external thermal transfer surface.

In some embodiments, the insulating housing is made of an insulating material comprising at least one of: mortar, polyurethane foam, pressed wood, epoxy.

In some embodiments, the fluid inlet and the fluid outlet of the water block unit are respectively fluidly connected to an inlet external conduit and an outlet external conduit; and placing the water block unit in the mold comprises inserting the inlet external conduit and the outlet external conduit in at least one recess defined by a wall of the mold such that the inlet and outlet external conduits extend through the wall.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

It is to be understood that terms relating to the position and/or orientation of components such as "upper", "lower", "top", "bottom", "front", "rear", "left", "right", are used herein to simplify the description and are not intended to be limitative of the particular position/orientation of the components in use.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
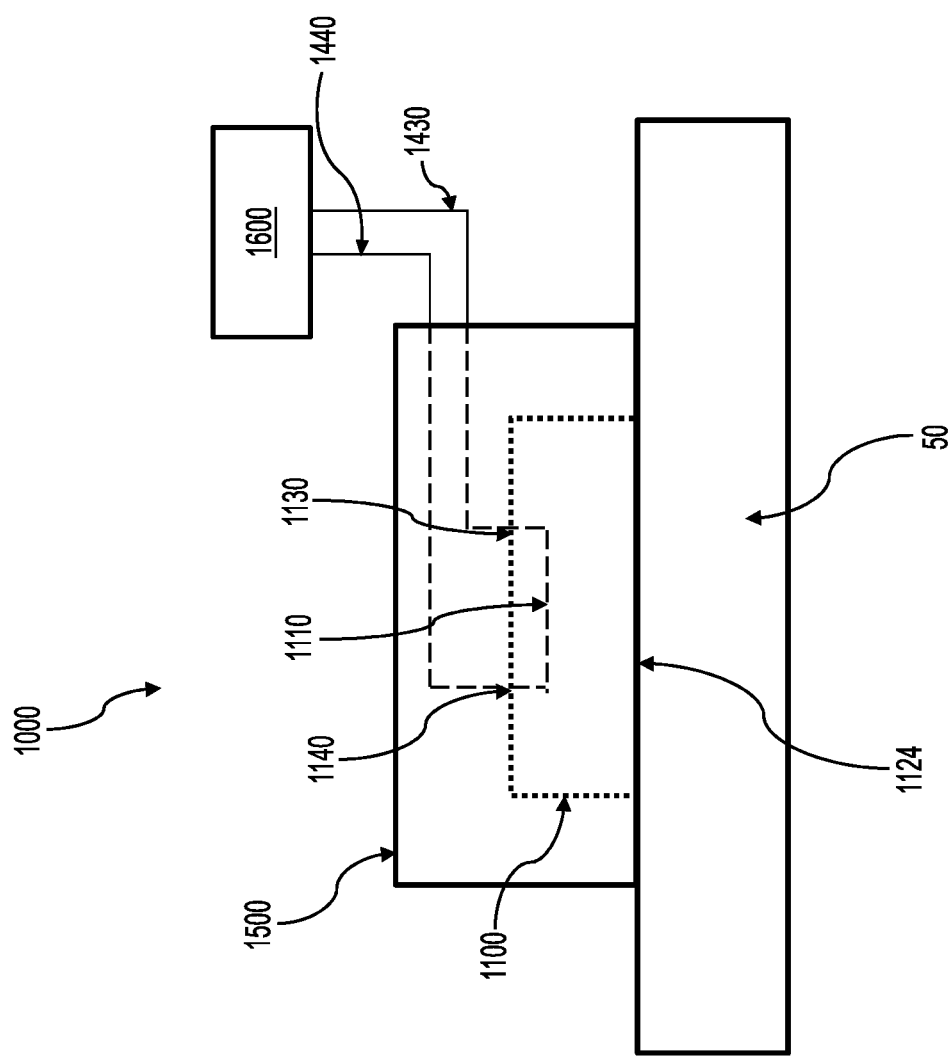
FIG. 1 is a front elevation view of a water block assembly according to an embodiment of the present technology, showing a water block unit installed on a heat-generating component to be cooled.

FIG. 1 illustrates a water block assembly 1000 in accordance with an embodiment of the present technology. The water block assembly 1000 includes a water block unit 1100 configured for cooling a heat-generating component 50. In this example, the heat-generating component 50 is a central processing unit (CPU) of a computer system and is mounted to a motherboard thereof. For instance, such a CPU may be part of a server operating within a data center. In use, the CPU 50 generates a significant amount of heat and, as is known, can benefit from cooling. It is contemplated that the heat-generating component 50 could be any other suitable heat-generating electronic component (e.g., a graphics processing unit (GPU)) or an intermediary component disposed between the water block unit 1100 and a heat-generating component.

In this embodiment, the water block unit 1100 is a heat sink that uses water (e.g., demineralized water) for transferring thermal energy. It is contemplated that a heat transfer fluid other than water could be used in the water block unit 1100 in other embodiments (e.g., a refrigerant). It is to be understood that the term "water block" is intended to include such thermal transfer devices that use fluids other than water and/or multiphase flow (e.g., two-phase flow). For example, in some instance, the fluid may be an oil, an alcohol, or a dielectric fluid (e.g., 3M Novec®).

As will be described in greater detail below, the water block assembly 1000 comprises an insulating housing 1500 partly embedding (i.e., enclosing closely) the water block unit 1100 and configured to limit heat transfer from the water block unit 1100 to a surrounding environment thereof. As will be explained below, the insulating housing 1500 can provide the water block assembly 1000 with increased cooling efficiency compared to a water block unit that is not embedded within an insulating housing.

With reference to FIG. 1, the water block unit 1100 defines an internal fluid conduit 1110 (schematically illustrated in FIG. 1) for circulating a heat transfer fluid therein, namely water in this embodiment. The water block unit 1100 defines a fluid inlet 1130 and a fluid outlet 1140 for respectively feeding and discharging water from the internal fluid conduit 1110. In this embodiment, the water block unit 1100 is fluidly connected to an external fluid system 1600 via an inlet fluid conduit 1430 and an outlet fluid conduit 1440 external to the water block unit 1100 and respectively fluidly connected to the fluid inlet 1130 and fluid outlet 1140. The external fluid system 1600 is configured to release thermal energy collected by the water block unit 1100 and return cooled water to the water block unit 1100. As will be appreciated, the external fluid system 1600 can includes different types of cooling systems known to a person skilled in the art (e.g., a dry cooler for servicing a data center). The external fluid system 1600 may comprise a pump (not shown) for pumping water to and from the water block unit 1100.

The water block unit 1110 has an external thermal transfer surface 1124 configured to be in contact with the heat-generating component 50. It is to be understood that in this context, the external thermal transfer surface 1124 is said to be "in contact" with the heat-generating component 50 even in cases where a thermal paste is applied between the external thermal transfer surface 1124 and the heat-generating component 50, in a manner that is known in the art, to ensure adequate heat transfer between the heat-generating component 50 and the external thermal transfer surface 1124. A height of the water block unit 1100 may be measured along a height direction that is normal to the external thermal transfer surface 1124.

Figure 2:
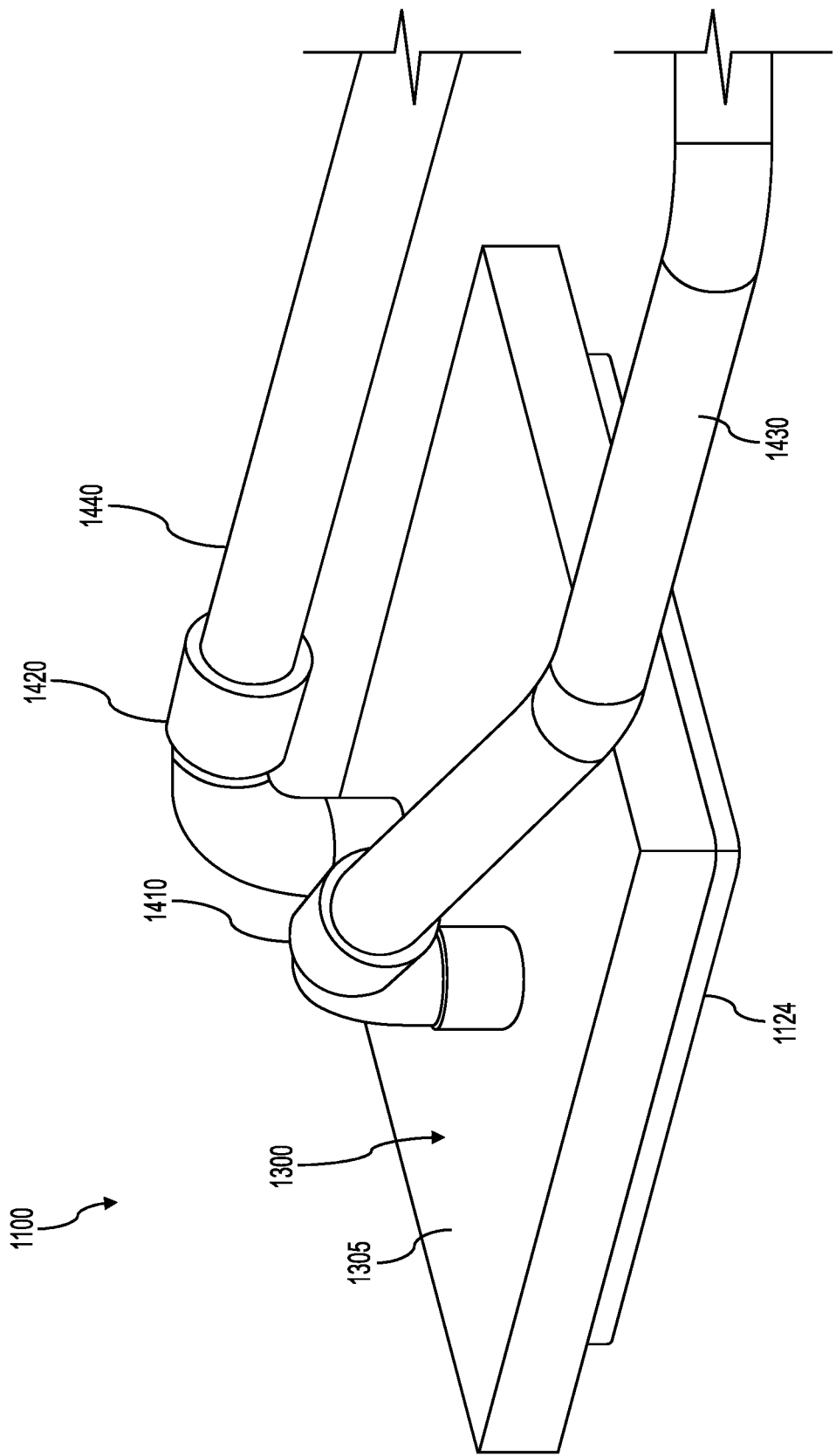
FIG. 2 is a perspective view, taken from a top, front, left side, of a water block unit of the water block assembly of FIG. 1.
Figure 3:
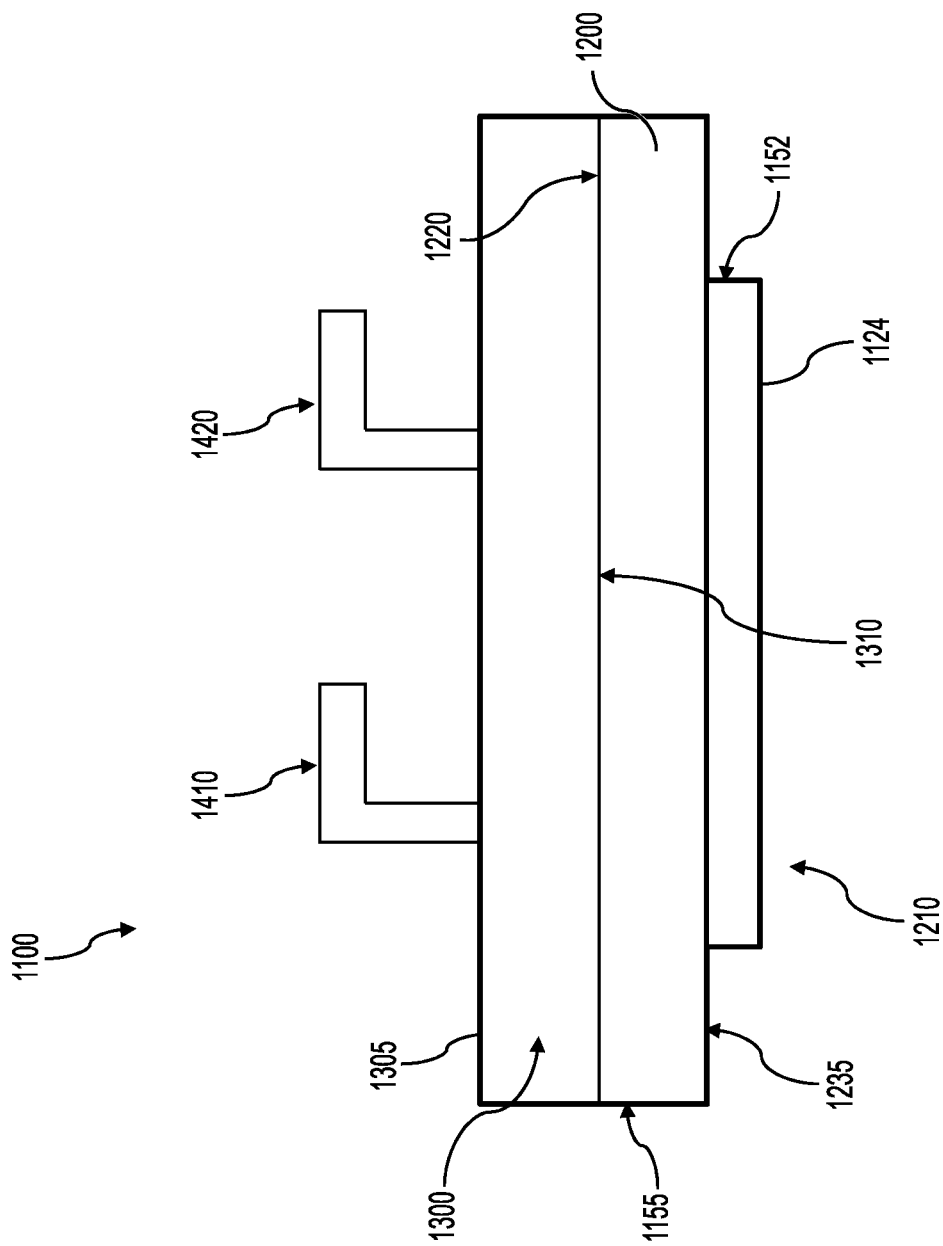
FIG. 3 is a front elevation view of the water block unit of FIG. 2.

With reference to FIGS. 2 and 3, in this embodiment, the water block unit 1100 includes a base portion 1200, and a cover portion 1300 affixed to the base portion 1200. Together, the base portion 1200 and the cover portion 1300 form a body of the water block unit 1100.

The base portion 1200 has a lower side 1210 and an upper side 1220 opposite the lower side 1210. The base portion 1200 includes the external thermal transfer surface 1124 defined on the lower side 1210. An inner upper surface of the base portion 1200 defines a continuous recess (not shown) that establishes a path of the internal fluid conduit 1110. The continuous recess may be machined into the inner upper surface of the base portion 1200. For example, the continuous recess can be milled into the inner upper surface by a milling machine (e.g., a numerically controlled mill). The continuous recess may be provided in the base portion 1200 in any other suitable way in other embodiments (e.g., molded). For instance, in this embodiment, the path of the internal fluid conduit 1110 is a generally "serpentine" path (i.e., a path describing at least one S-shaped curve). The internal fluid conduit 1110 may define a different type of path in other embodiments. Such types of paths are described in detail in U.S. patent application Ser. No. 16/546,785, published on Mar. 5, 2020, the entirety of which is incorporated by reference herein.

Figure 4:
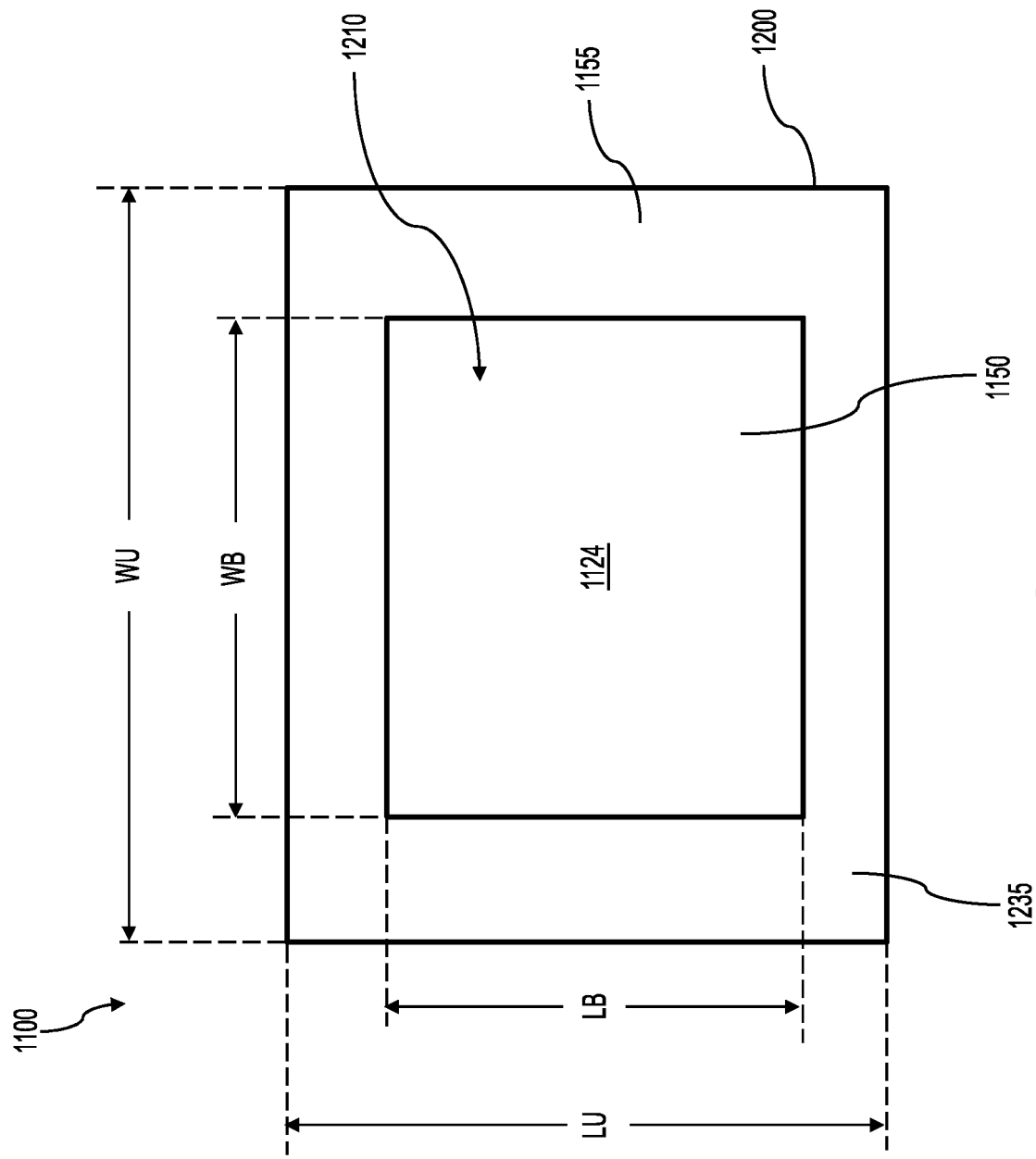
FIG. 4 is a bottom plan view of the water block unit of FIG. 2.

As best shown in FIG. 3, in this embodiment, the base portion 1200 has an external shoulder 1235 such that the base portion 1200 has a bottom section 1152 and an upper section 1155 demarcated from one another by the shoulder 1235. As can be seen in FIG. 4, the bottom section 1152 has a length LB and a width WB that are smaller than a length LU and a width WU of the upper section 1155. It is contemplated that, in some embodiments, the external shoulder 1235 may be omitted.

The cover portion 1300 is disposed atop the base portion 1200. In this embodiment, the base portion 1200 and the cover portion 1300 are welded to one another. In particular, in this embodiment, the base and cover portions 1200, 1300 are laser welded to one another.

In this embodiment, the cover portion 1300 defines the fluid inlet 1130 and the fluid outlet 1140 of the water block unit 1100. In particular, the cover portion 1300 defines two openings (not shown) extending from an upper side 1305 to a lower side 1310 (FIG. 3) of the cover portion 1300 and corresponding to the fluid inlet 1130 and the fluid outlet 1140 respectively. As can be seen in FIG. 2, in this embodiment, the inlet fluid conduit 1430 and the outlet fluid conduit 1440 are connected to the cover portion 1300 on the upper side 1305 and fluidly communicate with the fluid inlet 1130 and the fluid outlet 1140 respectively. In some embodiments, respective connectors (not shown) such as elbow connectors could be connected between the conduits 1430, 1440 and the fluid inlet 1130 and fluid outlet 1140 to act as an interface therebetween.

In this embodiment, the cover portion 1300 has a lower planar surface on the lower side 1310. Together, the lower planar surface of the cover portion 1300 and the continuous recess defined by the base portion 1200 define the internal fluid conduit 1110 of the water block unit 1100. In other embodiments, the lower planar surface of the cover portion 1300 may define a continuous recess corresponding to the continuous recess defined by the base portion 1200 and together, both continuous recesses define the internal fluid conduit 1110.

In this embodiment, the base portion 1200 and the cover portion 1300 are made of a thermally conductive material such as metal, for instance copper or aluminum. However, it is contemplated that the base portion 1200 and the cover portion 1300 could be made from a different thermally conductive material in other embodiments, including combining different materials (e.g., cover portion 1300 made from a different material than the base portion 1200).

As will be appreciated, the water block unit 1100 described above is an illustrative example of a water block unit 1100 for the purpose of understanding the present disclosure and is not intended to be limitative to the present technology. Notably, the water block unit 1100 may be configured differently in other embodiments. For instance, in some embodiments, the water block unit 1100 may be a single integral component defining the internal fluid conduit 1110 therein. For example, the water block unit 1100 could be made by an additive manufacturing process such as 3D printing.

A method for forming the insulating housing 1500 in order to insulate the water block unit 1100 will now be described with reference to FIGS. 5 to 9.

Figure 8:
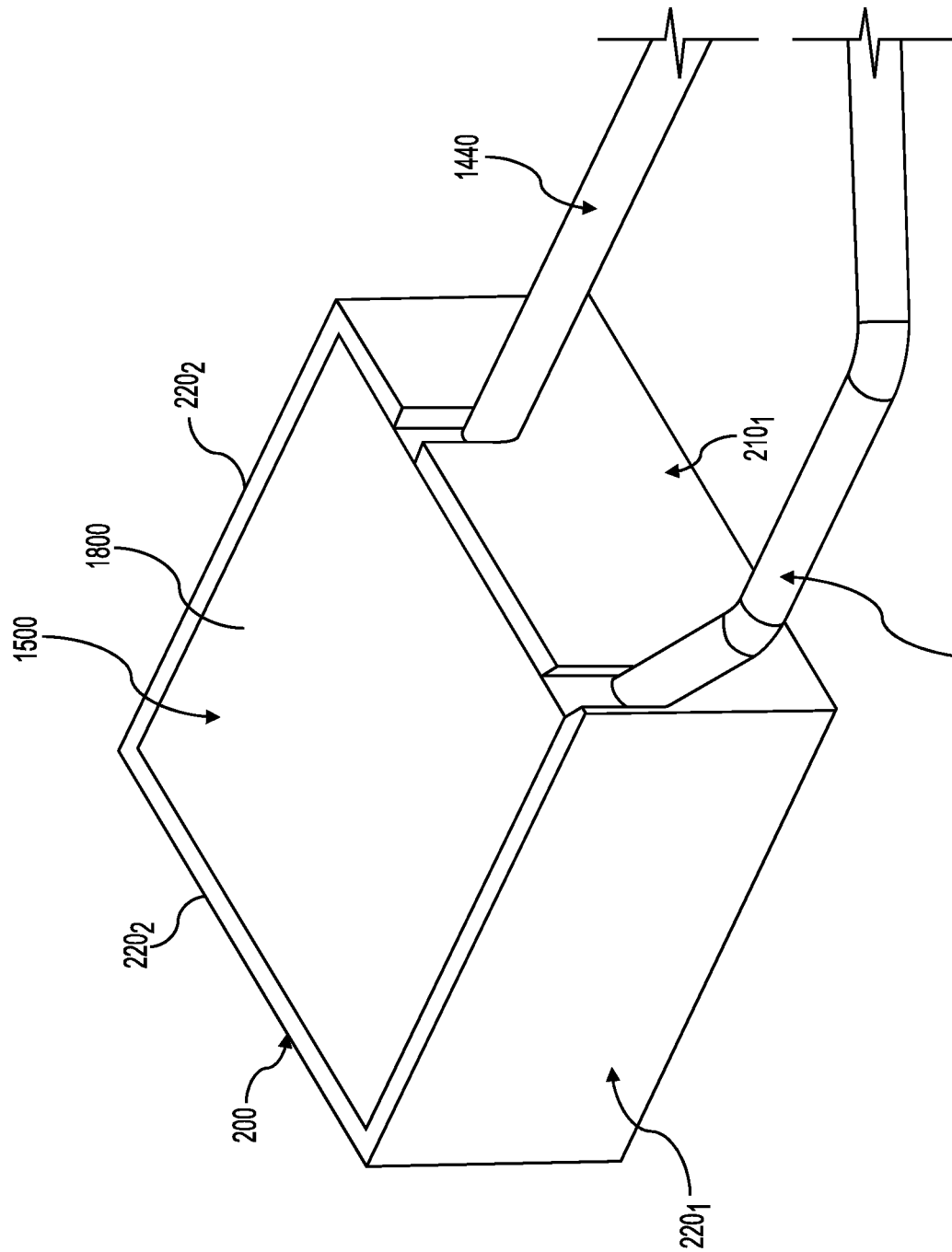
FIG. 8 is a perspective view, taken from a top, front, left side, of the mold and the water block unit, showing the mold filled with an insulating material.
Figure 9:
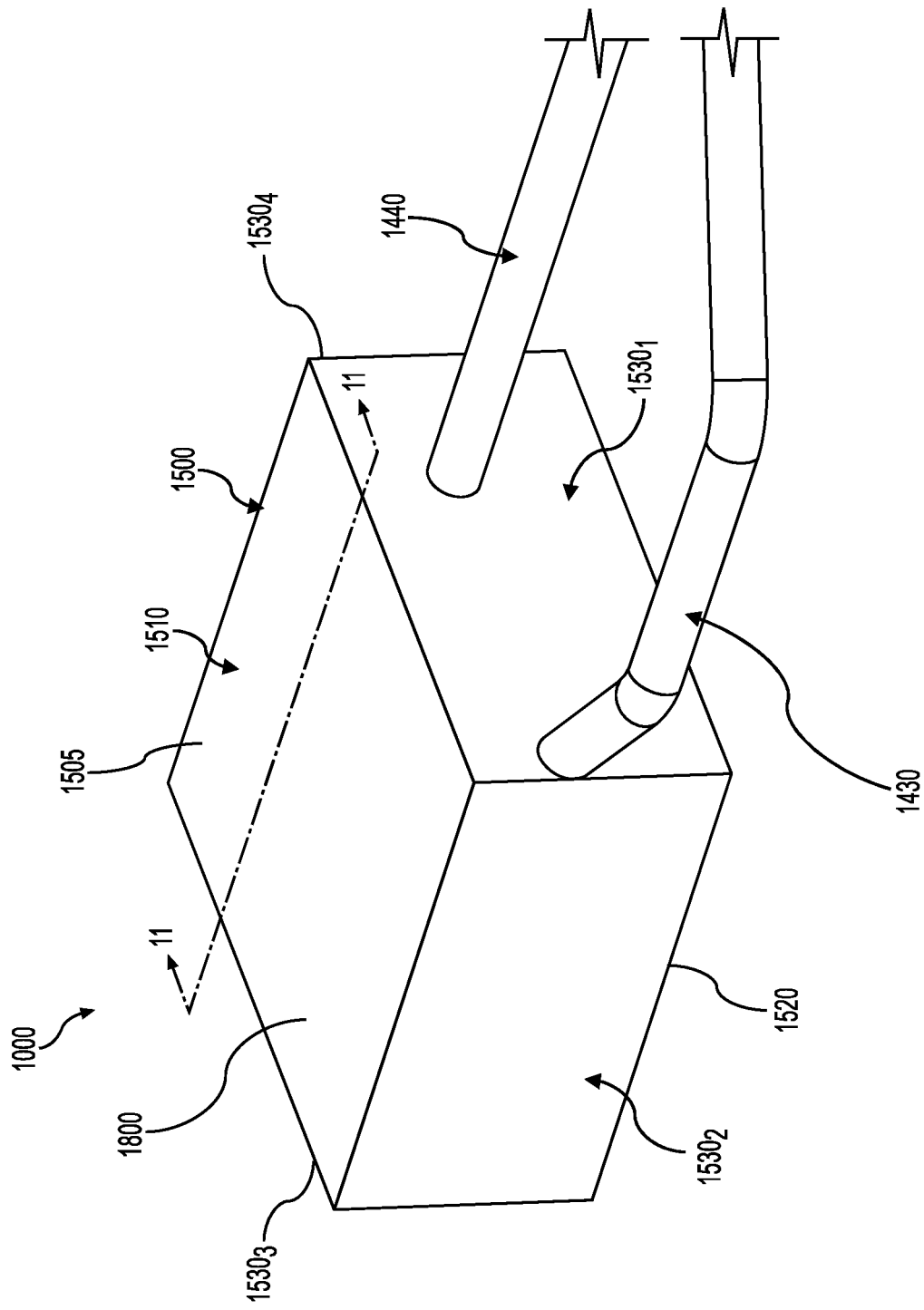
FIG. 9 is a perspective view, taken from a top, front, left side, of the water block assembly of FIG. 1.

First, as shown in FIGS. 8 and 9, a mold 200 is provided. In this embodiment, the mold 200 has two opposite upright lateral walls $210_1$, $210_2$, and two opposite upright longitudinal walls $220_1$, $220_2$ extending from the upright lateral walls $210_1$, $210_2$ at a right angle such that the four upright walls $210_1$, $210_2$, $220_1$, $220_2$ generally define a rectangular cross-section. The mold 200 also has a bottom wall 250 extending between the four upright walls $210_1$, $210_2$, $220_1$, $220_2$. Together, the upright walls $210_1$, $210_2$, $220_1$, $220_2$ and the bottom wall 250 define an internal space 255 of the mold 200.

In this embodiment, the mold 200 is an open mold, namely as the mold 200 does not have a top wall such that the internal space 255 is accessible without removing any part of the mold 200. It is contemplated that, in other embodiments, the mold 200 may be a closed mold having separate components that are fitted together to close the internal space 255 of the mold 200 during use thereof. For example, in some embodiments, the mold 200 may include a bottom portion and a top portion that are secured together in order to form the internal housing 1500.

As can be seen, in this embodiment, the internal space 255 bound by the four upright walls $210_1$, $210_2$, $220_1$, $220_2$ and the bottom wall 250 has a generally cuboid shape and is dimensioned to receive the water block unit 1100 therein. It is contemplated that the internal space 255 could be shaped differently in other embodiments and still be shaped to receive the water block unit 1100.

Figure 6:
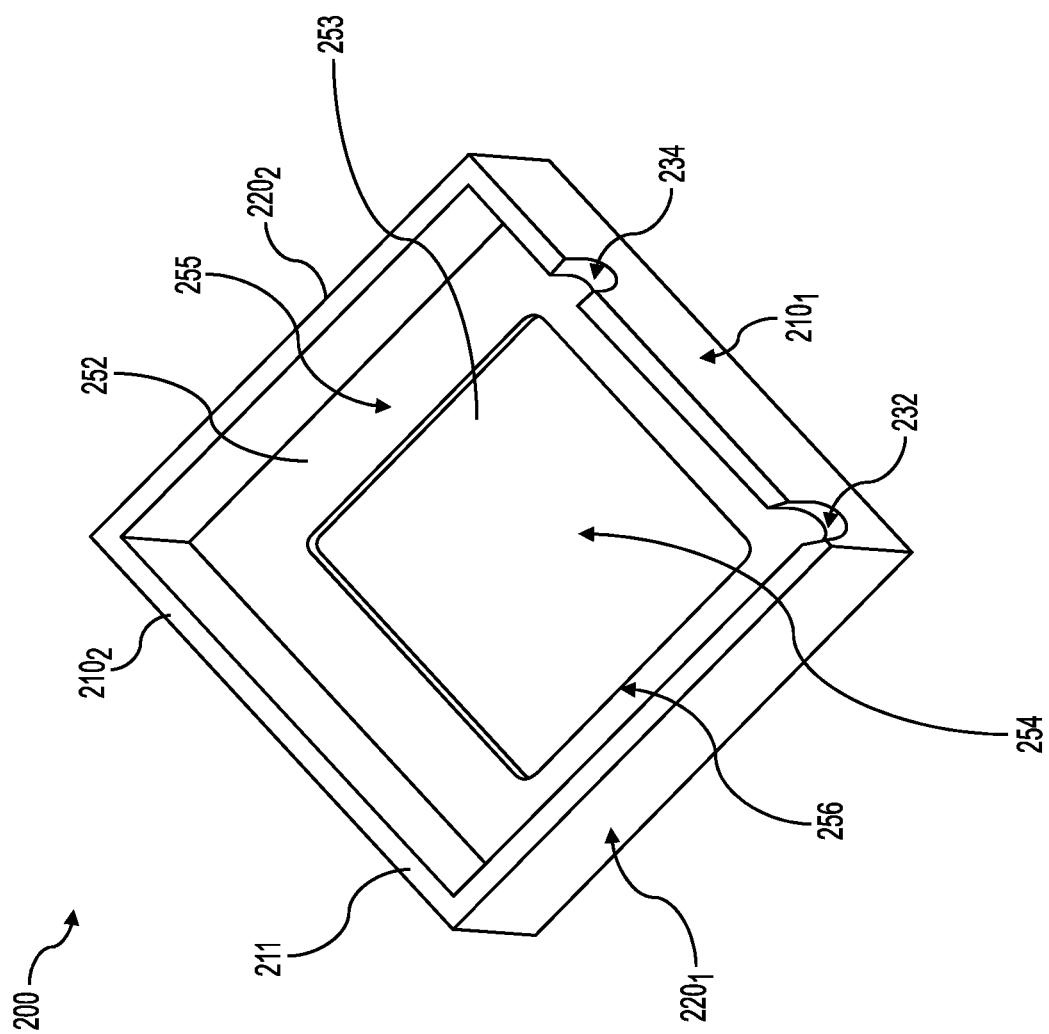
FIG. 6 is another perspective view, taken from a top, front, left side, of the mold of FIG. 5.

As shown in FIG. 6, in this embodiment, the bottom wall 250 has an inner bottom surface 252 which defines a recess 254 that is configured to receive the bottom section 1152 of the water block unit 1100. Notably, the recess 254 is shaped and dimensioned such that part of the bottom section 1152 fits snugly therein. In particular, in this example, the recess 254 is generally rectangular to match the rectangular shape of the bottom section 1152. In this embodiment, a depth of the recess 254, corresponding to a size of a peripheral edge 256 in the height direction, is less than the height of the bottom section 1152 of the base portion 1200.

Figure 5:
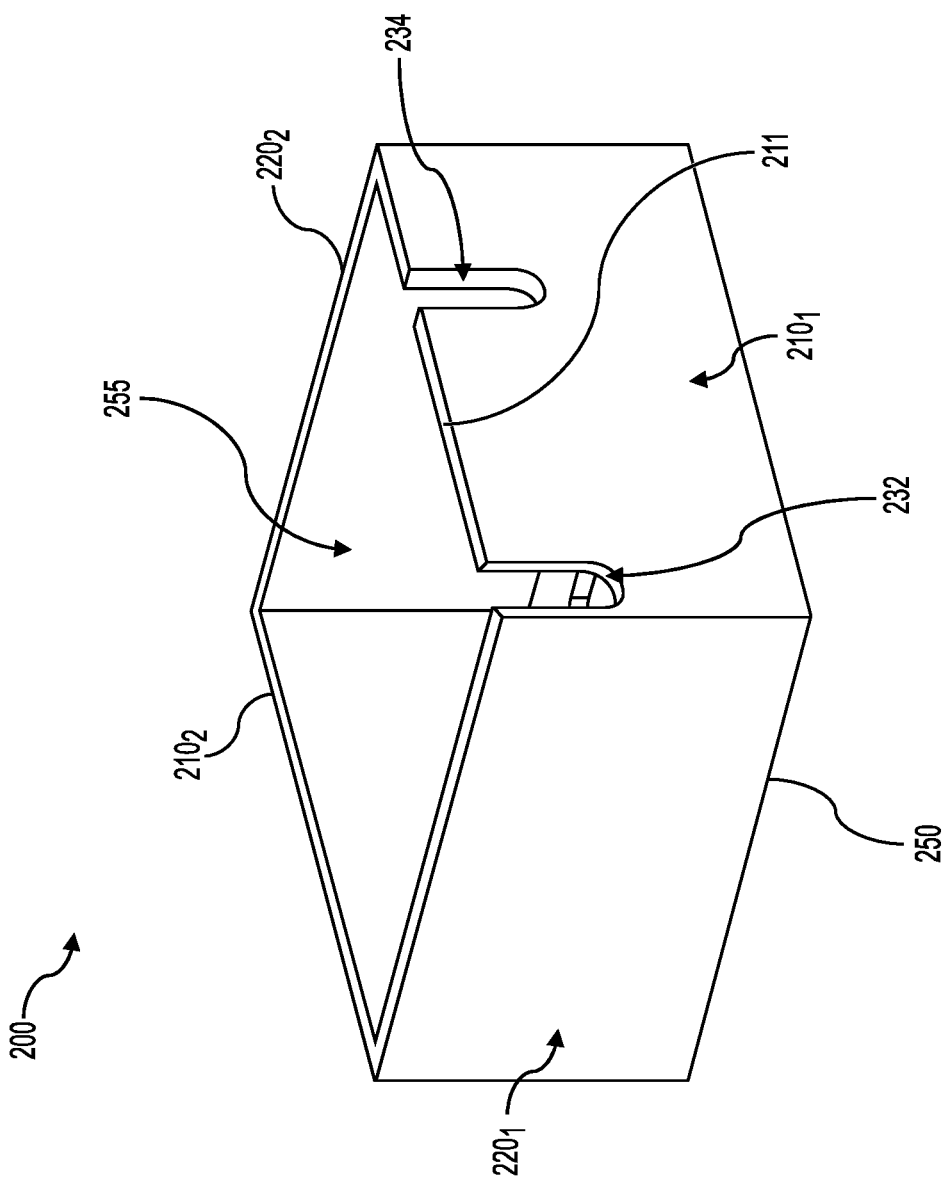
FIG. 5 is a perspective view, taken from a top, front left side, of a mold for forming an insulating housing of the water block assembly according to an embodiment of the present technology.

As best shown in FIG. 5, in this embodiment, the upright lateral wall $210_1$ of the mold 200 defines two conduit recesses 232, 234 configured to receive the conduits 1430, 1440 respectively during molding of the insulating housing 1500, as will be explained in more detail below. The recesses 232, 234 extend downward from an upper edge 211 of the upright lateral wall $210_1$. In other embodiments, the conduit recesses 232, 234 may be defined by different ones of the upright walls $210_1$, $210_2$, $220_1$, $220_2$ (e.g., the recess 232 could be defined by another one of the upright walls than the recess 234). In yet other embodiments, the conduit recesses 232, 234 may be omitted (e.g., the conduits 1430, 1440 could instead extend out of the mold 200 via the open top of the mold 200).

In this embodiment, the mold 200 is made of a polymeric material. Notably, the mold 200 is made of silicone. It is contemplated that the mold 200 could be made of any other suitable material in other embodiments.

Figure 7:
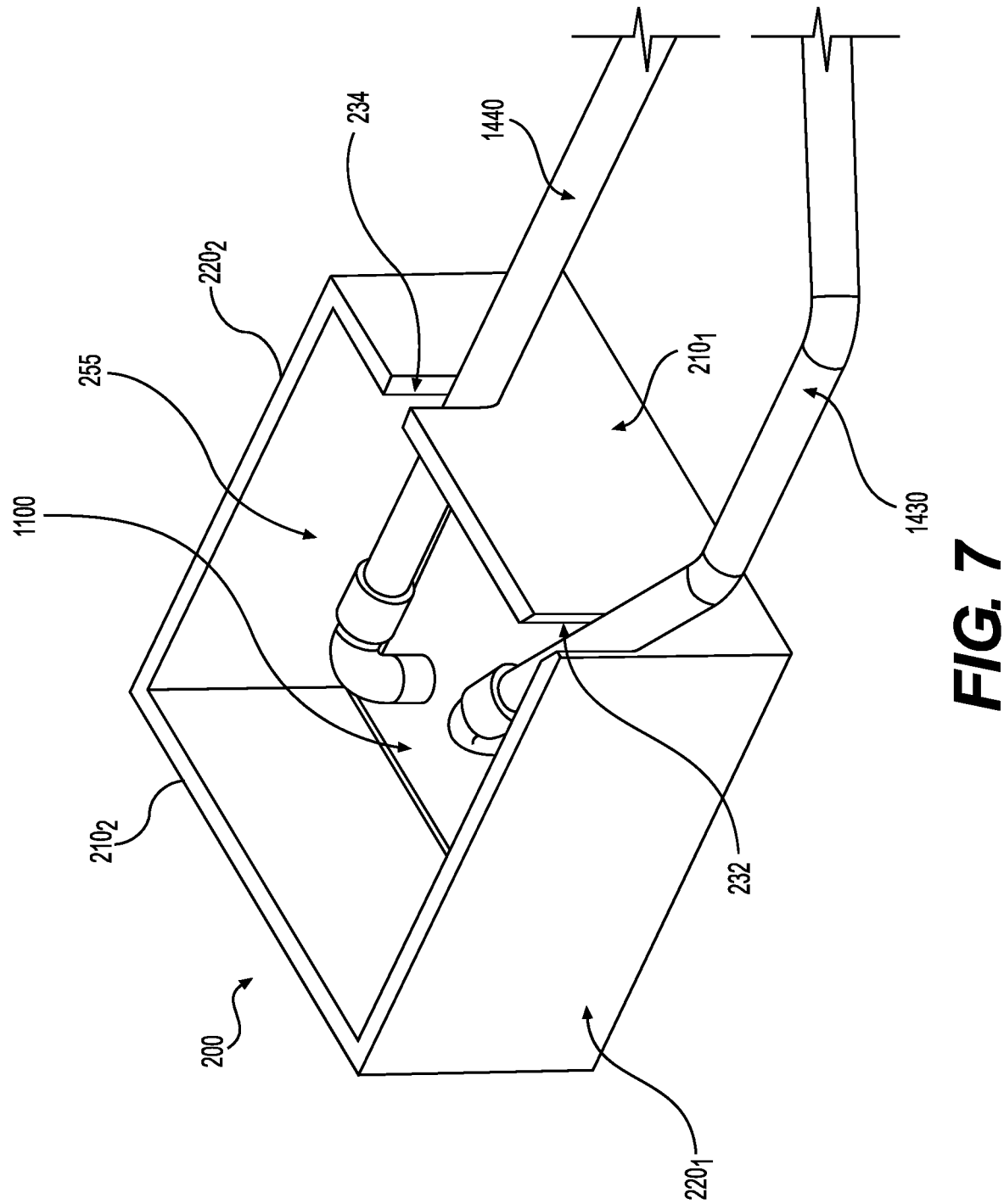
FIG. 7 is a perspective view, taken from a top, front, left side, of the mold and the water block unit prior to forming the insulating housing.

As shown in FIG. 7, with the mold 200 provided, the water block unit 1100 is placed within the internal space 255. In particular, the external thermal transfer surface 1124 is placed in contact with a recessed surface 253 of the bottom wall 250 defining the recess 254. In particular, in this embodiment, the bottom section 1152 of the base portion 1200 of the water block unit 1100 is received within the recess 254. In this embodiment, the bottom section 1152 thus acts as a locating means that facilitates placing the water block unit 1100 within the internal space 255. As such, once the molding process is finished, the external thermal transfer surface 1124 is not covered by the insulating housing 1500 formed by the molding process.

Furthermore, as can be seen in FIG. 7, the water block unit 1100 is placed within the mold 200 with the conduits 1430, 1440 being connected to cover portion 1300. Notably, the mold 200 is made to accommodate the conduits 1430, 1440. In particular, as mentioned above, in this embodiment, the recesses 232, 234 defined by the upright lateral wall $210_1$ of the mold 200 are positioned and dimensioned to receive the conduits 1430, 1440 such that the conduits 1430, 1440 extend through the upright lateral wall $210_1$ once the water block unit 1100 is placed therein. By placing the water block 1100 within the mold 200 with the conduits 1430, 1440 connected thereto, the connection between the conduits 1430, 1440 and the water block unit 1100 may be made more robust by encasing the interfaces between the conduits 1430, 1440 and the water block unit 1100 within the insulating housing 1500.

Once the water block unit 1100 is in place within the mold 200, the mold 200 is filled with an insulating material 1800 in a pliable raw state (i.e., uncured), for instance in a liquid or fluid state, to overmold the water block unit 1100. Overmolding refers to a molding process by which a material (or combination of materials) is molded over a substrate object (in this example, the water block unit 1100) to create an integral assembly. The water block unit 1100 disposed within the mold 200 is thus covered by the insulating material 1800 in the pliable raw state such that the insulating material 1800 comes into contact with the exposed surfaces of the water block unit 1100. As mentioned above, in this embodiment, part of the bottom section 1152 of the base portion 1200 of the water block unit 1100 (which will be referred to as the "bottom portion" 1150 of the water block unit 1100) is received in the recess 254 and therefore the insulating material 1800 does not cover the bottom portion 1150 of the water block unit 1100. In some embodiments, the mold 200 may be designed such that none of the bottom section 1152 is covered by the insulating material 1800.

The insulating material 1800 may be filled within the mold 200 in any suitable way. For instance, the insulating material 1800 may be prepared in a separate container and poured into the mold 200. In embodiments in which the mold 200 is more complex, any other suitable known molding technique may be used, such as injection molding processes. For instance, in some embodiments, a more complex mold may be designed to overmold various water block units 1100 simultaneously.

In this embodiment, the insulating material 1800 is mortar (e.g., air-entrained mortar). In some embodiments, the insulating material 1800 may include one or more of mortar, polyurethane foam, pressed wood, epoxy, or any other suitable insulating material. Notably, in this embodiment, the insulating material 1800 has a relatively low thermal conductivity, for example a thermal conductivity of less than 1 W/mK. In some embodiments, the thermal conductivity of the insulating material 1800 may be less than 0.1 W/mK. In some embodiments, the insulating material 1800 may be a layered composite (e.g., including layers of paint and mortar) which may help in reducing the associated costs of the insulating housing 1500.

After filling the mold 200 with the insulating material 1800, the insulating material 1800 is cured until it is in a solidified state and forms the insulating housing 1500 that partly embeds the water block unit 1100. The curing process (e.g., time and/or temperature) of the insulating material 1800 may vary depending on the insulating material 1800 being used. Once the insulating material 1800 is cured, the water block assembly 1000 is removed from the mold 200.

Using the mold 200 to form the insulating housing 1500 is useful to quickly and repeatably form various such insulating housings 1500, particularly if it is desired to provide such an insulating housing for various water block units. For instance, this may be the case in a data center where multiple water block units may be employed for cooling different heat-generating components. Moreover, the molding process may be automated for efficiency. However, in other embodiments, the process for obtaining the insulating housing 1500 may not involve the mold 200. For instance, the process may be manual and consist of applying layers of the insulating material 1800 by hand.

Furthermore, it is contemplated that, in some embodiments, after forming the insulating housing 1500, additional manufacturing processes may be applied to the formed insulating housing 1500 (e.g., grinding, drilling, or others).

Figure 10:
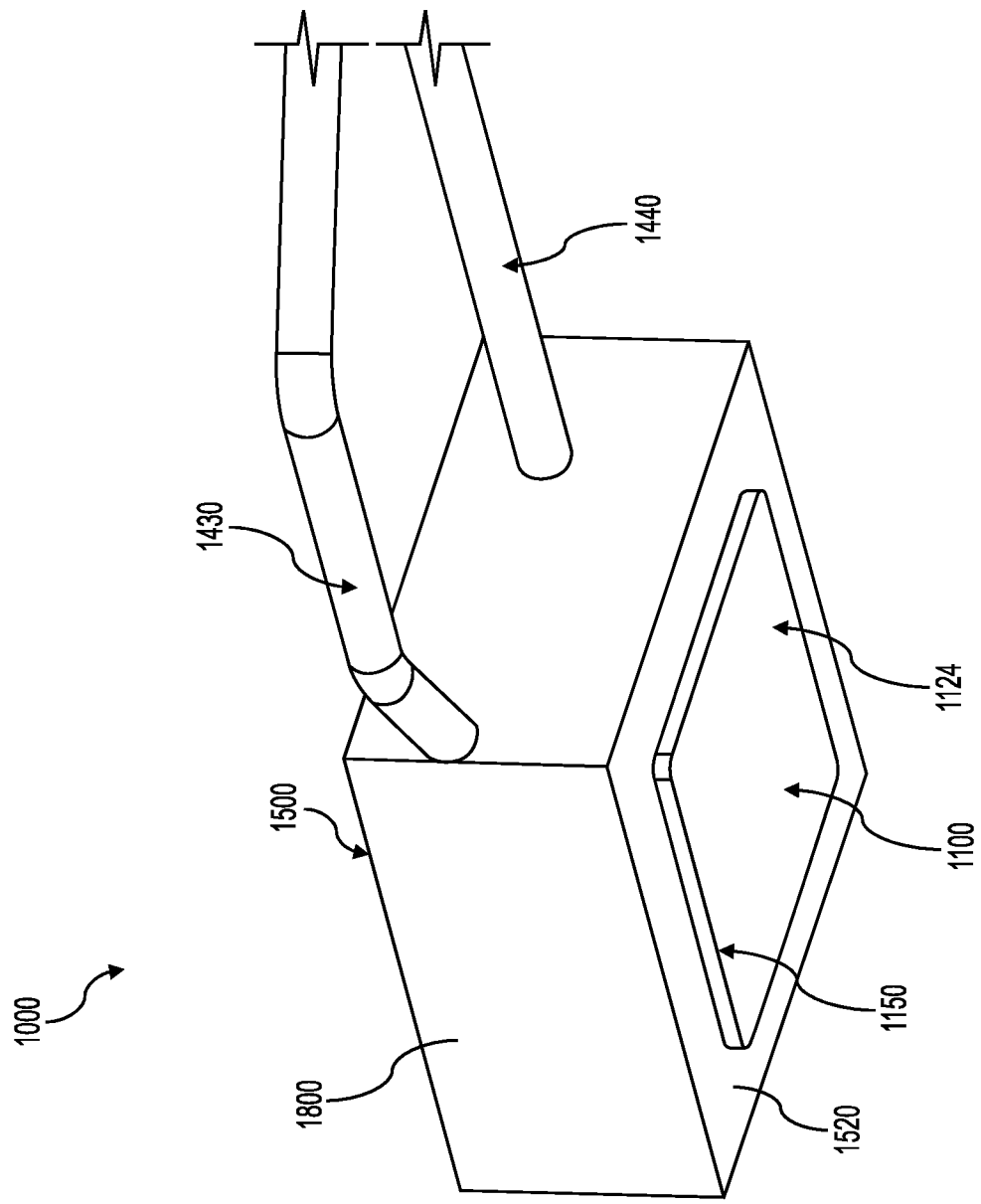
FIG. 10 is a perspective view, taken from a bottom, front, left side, of the water block assembly of FIG. 10.
Figure 11:
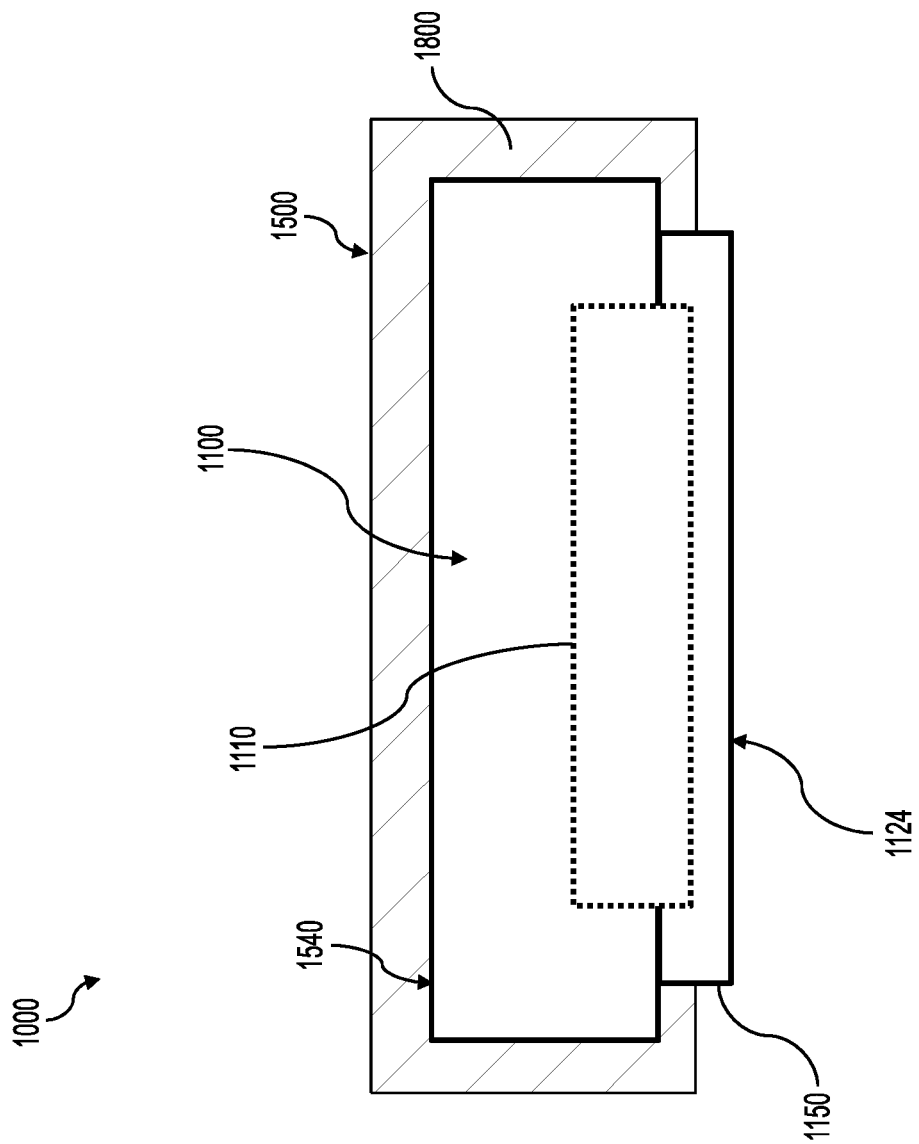
FIG. 11 is a cross-sectional view of the water block assembly of FIG. 10 taken along line 11-11 in FIG. 9, with the heat-generating component shown for reference.

With reference to FIGS. 9 to 11, the resulting insulating housing 1500 partly embeds the water block unit 1100 such, that, in use, a transfer of thermal energy from the water block unit 1100 to a surrounding environment thereof is limited. The insulating housing 1500 has external surfaces formed by the inner surfaces of the mold 200. Notably, in this embodiment, the insulating housing 1500 has an upper external surface 1510, a lower external surface 1520, and four upright external surfaces $1530_1$, $1530_3$, $1530_3$, $1530_3$. In this embodiment, the lower external surface 1520 extends generally parallel to the external thermal transfer surface 1124 and is offset from the external thermal transfer surface 1124 in the height direction. In particular, the lower external surface 1520 of the insulating housing 1500 is vertically higher than the external thermal transfer surface 1124.

It is contemplated that the external surfaces of the insulating housing 1500 may be configured differently in other embodiments, depending on the inner surfaces of the mold 200 used during the molding process. For instance, in some embodiments, external thermal transfer surface 1124 and the lower external surface 1520 of the insulating housing 1500 may be flush with one another (e.g., if the inner bottom surface 252 of the mold 200 does not define the recess 254).

As shown in FIG. 11, the insulating housing 1500 also has internal surfaces 1540 in contact with the water block unit 1100 and the conduits 1430, 1440. Notably, the internal surfaces 1540 are in contact with some of the external surfaces of the water block unit 1100 and of portions of the conduits 1430, 1440. As will be appreciated, the insulating housing 1500 is not a hollow housing, as the insulating material 1800 of the insulating housing 1500 fills a volume defined between the internal surfaces 1540 and the external surfaces of the insulating housing 1500. It is contemplated that the internal surfaces 1540 of the insulating housing 1500 may be configured differently in other embodiments, depending on the shape of the water block unit 1100 and the conduits 1430, 1440.

As can be seen, in this embodiment, the connections between the inlet and outlet external conduits 1430, 1440 and the water block unit 1100 are embedded within the insulating housing 1500. More specifically, the interfaces between the fluid inlet and fluid outlet 1130, 1140 with the inlet and outlet external conduits 1430, 1440 are surrounded by the insulating material 1800 of the insulating housing 1500. This may strengthen the connections between the fluid inlet and fluid outlet 1130, 1140 with the inlet and outlet external conduits 1430, 1440 as these connections are secured in place and supported by the insulating material 1800. In addition, by embedding the connections between the inlet and outlet external conduits 1430, 1440 and the water block unit 1100 within the insulating housing 1500, a risk of leaks from these connections is reduced which may therefore contribute in improving the efficiency of the water block unit 1100. Notably, the insulating material 1800 of the insulating housing 1500 may act as a seal at the connections between the inlet and outlet external conduits 1430, 1440 and the water block unit 1100.

As will be appreciated from the above description, the present technology provides a quick and inexpensive manner in which the water block unit 1100 can be insulated. Notably, the insulating housing 1500 insulates the water block unit 1100 to limit heat loss from the water block unit 1100 to the surrounding environment thereof. This improves heat retention by the water block unit 1100 and thus the transfer of heat from the water block unit 1100 to the external fluid system 1600 compared to if the water block unit 1100 were not insulated, which may can in turn the efficiency of thee external fluid system 1600 in general. In addition, this may also limit the transfer of heat from the water block unit 1100 to the surrounding environment which may reduce the temperature of the environment. As such, use of air cooling within the environment of the water block unit 1100 may be reduced as a consequence and, moreover, the temperature of the surrounding environment of the heat-generating component 50 may be reduced.

Furthermore, the increased heat recovery of the water block unit 1100 can be repurposed for additional processes. For instance, it is contemplated that the additional heat recovered by the water block unit 1100 could be used for purposefully heating a space (e.g., heating adjoining offices) and/or for purposes of electricity generation in an Organic Rankine Cycle (ORC), or for transfer to evaporators such as for use in the treatment of leachate.

Moreover, it is contemplated that, in some embodiments, the insulating housing 1500 may be used for securing the water block unit 1100 in place on a substrate (e.g., a motherboard) to which the heat-generating component 50 is connected. For instance, the insulating housing 1500 may be fastened to the substrate via mechanical fasteners (e.g., bolts) or any suitable securing device (e.g., a clamp).

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A water block assembly comprising:
   a water block unit having an external thermal transfer surface configured to be in contact with a heat generating electronic component to be cooled, the water block unit defining:
      an internal fluid conduit for circulating fluid therein;
      a fluid inlet for feeding fluid into the internal fluid conduit; and
      a fluid outlet for discharging fluid from the internal fluid conduit; and
   an insulating housing, formed of an insulating material, at least partly embedding the water block unit therein to limit heat transfer from the water block unit to a surrounding environment thereof, the insulating housing having an internal surface in contact with the water block unit and an external surface in contact with air, wherein the insulating material forms the internal surface and the external surface.

2. The water block assembly of claim 1, wherein the water block unit comprises:
   a base portion defining the external thermal transfer surface; and
   a cover portion affixed to the base portion, the cover portion defining the fluid inlet and the fluid outlet,
   the base portion and the cover portion defining the internal fluid conduit together.

3. The water block assembly of claim 1, wherein:
   the insulating housing has a lower external surface extending generally parallel to the external thermal transfer surface.

4. The water block assembly of claim 1, wherein:
   the water block unit has lateral side surfaces extending upward from the external thermal transfer surface; and
   a portion of the water block unit is not overlapped by the insulating housing, the portion including the external thermal transfer surface and at least part of the lateral side surfaces of the water block unit such that the insulating housing is clear of the heat generating electronic component when the external thermal transfer surface is in contact with the heat generating electronic component.

5. The water block assembly of claim 1, wherein the insulating material comprises mortar.

6. The water block assembly of claim 1, wherein the fluid inlet and the fluid outlet are embedded by the insulating housing.

7. The water block assembly of claim 6, wherein an inlet external conduit and an outlet external conduit are fluidly connected to the fluid inlet and the fluid outlet respectively, a portion of each of the inlet and outlet external conduits being embedded by the insulating housing.

8. The water block assembly of claim 7, wherein an interface between the inlet external conduit and the fluid inlet and an interface between the outlet external conduit and the fluid outlet are embedded by the insulating housing.

9. The water block assembly of claim 1, wherein:
   the insulating material fills a volume defined between the internal surface and the external surface of the insulating housing.

10. The water block assembly of claim 1, wherein the insulating housing is overmolded on the water block unit.

11. The water block assembly of claim 1, wherein the insulating material comprises polyurethane foam.

12. The water block assembly of claim 1, wherein the insulating material comprises pressed wood.

13. The water block assembly of claim 1, wherein the insulating material comprises epoxy.

* * * * *